United States Patent [19]

Ruder et al.

[11] Patent Number: 4,873,168
[45] Date of Patent: Oct. 10, 1989

[54] IMAGING SYSTEM UTILIZING HEAT TREATMENT

[75] Inventors: Donna L. Ruder, Dayton; Lyudmila Feldman, Centerville; James A. Dowler, Franklin, all of Ohio

[73] Assignee: The Mead Corporation, Dayton, Ohio

[21] Appl. No.: 164,653

[22] Filed: Mar. 7, 1988

[51] Int. Cl.$^4$ .......................... G03C 5/54; G03C 1/68; G03C 5/00

[52] U.S. Cl. .................................... 430/138; 430/211; 430/235; 430/203; 430/349; 428/320.2

[58] Field of Search ............... 430/138, 211, 235, 349, 430/203; 428/320.6

[56] References Cited

U.S. PATENT DOCUMENTS

| | | | |
|---|---|---|---|
| 4,399,209 | 8/1963 | Sanders et al. | 430/138 |
| 4,440,846 | 4/1984 | Sanders et al. | 430/211 |
| 4,482,624 | 11/1984 | Arney et al. | 430/138 |
| 4,535,050 | 8/1985 | Adair et al. | 430/138 |
| 4,576,891 | 3/1986 | Adair | 430/138 |
| 4,622,282 | 11/1986 | Head et al. | 430/138 |
| 4,663,266 | 5/1987 | Adair et al. | 430/138 |

Primary Examiner—Richard L. Schilling
Attorney, Agent, or Firm—Smith & Schnacke

[57] ABSTRACT

A method for treating an imaging sheet is disclosed. The method includes the steps of providing an imaging sheet having coated on one of its surfaces a layer of microcapsules, the microcapsules containing a radiation curable composition and having an image-forming agent associated therewith, heating the sheet; and image-wise exposing the layer of microcapsules to actinic radiation; wherein the heating step is performed prior to or after the image-wise exposing step. The method reduces or removes damage defects on the imaging sheet and, in some instances, extends the dynamic range of the image-forming agents.

14 Claims, No Drawings

IMAGING SYSTEM UTILIZING HEAT TREATMENT

BACKGROUND OF THE INVENTION

1. Field of the Invention

The present invention relates to image-forming systems, and more particularly systems employing photosensitive microcapsules which are heat treated prior to developing.

2. Description of the Prior Art

Imaging systems employing photosensitive microcapsules are described in U.S. Pat. Nos. 4,399,209 and 4,440,846, assigned to The Mead Corporation. These patents teach the formation of images by the exposure-controlled release of an image-forming agent from a microcapsule containing a photohardenable composition. The image-forming agent is typically a substantially colorless color precursor which reacts with a developer to form a visible image.

According to U.S. Pat. No. 4,399,209, the imaging system is characterized as a transfer imaging system (i.e., the image-forming agent is image-wise transferred to a developer or copy sheet where the image-forming agent reacts with a developer to form an image).

In U.S. Pat. No. 4,440,846, the imaging system is a so called "self-contained" system wherein both the image-forming agent and the developer material are located on the same substrate. In the system according to U.S. Pat. No. 4,440,846, the image-forming agent is encapsulated in a layer of pressure rupturable capsules, and the subsequent exposure and capsule rupture causes the image-forming agent to contact and react with the developer to produce an image on the substrate.

U.S. patent application Ser. No. 339,917, filed Jan. 18, 1982, discloses a full color imaging system wherein three sets of microcapsules which are sensitive to different bands of actinic radiation are employed. These microcapsules respectively contain cyan, magenta and yellow color precursors.

A panchromatic full color imaging system wherein a panchromatic imaging sheet is exposed to visible light and subsequently developed is described in published European application No. 0233567.

Although the above-described inventions have significantly advanced imaging system technology, the inventions still suffer from minor drawbacks.

For example, the background of the sheet containing the developed image produced from the microcapsules has suffered from being inconsistent. Ideally, the background of the sheet containing the developed image should be a continuous, defect free, white surface.

Further, the substrates containing the microcapsules have been prone to defects which, in turn, produce defective images. These defects are often caused during the shipment and handling of the substrates when some of the microcapsules inadvertently rupture. As a result of the inadvertent rupturing, the images produced by the imaging process also possess the defects contained on the microcapsule substrate.

In addition, it has been difficult to produce continuous tone images due to the limited dynamic range of the microcapsules utilized. This is demonstrated by the high gamma obtained on corresponding H & D curves.

Further, when utilizing a full color system, the H & D curves for each of the different color forming microcapsules utilized are different, causing a misalignment of the curves. Accordingly, it has been difficult to obtain a neutral media image.

Although attempts have been made in the art to correct some of these above-described problems, until the present invention a solution has not been proposed which can easily remedy these defects.

For example, U.S. Pat. No. 4,576,891 to Adair et al., proposes a possible solution to the handling problems associated with microcapsule sheets. The solution proposed is the addition of substances to the sheets to improve handling characteristics. Typical additives suggested are stilt materials such as starch particles and silica particles. The Adair et al., proposal suffers from the drawback that it requires the addition of material to the sheets, thereby increasing material costs. Further, Adair et al., is silent on how to overcome problems with dynamic range.

Accordingly, there exists a need in the art for a simple imaging process which may be utilized to produce continuous tone images while minimizing background hue problems and handling problems.

BRIEF SUMMARY OF THE INVENTION

In accordance with the present invention, an imaging process which produces images having an improved background is disclosed. In addition, the imaging sheets which are processed according to the present invention produce images which are able to remove defects occurring to the microcapsules caused during shipping and handling. Further, by utilizing the present invention, improved continuous tone images may be produced. The imaging process is characterized by utilizing a heat treatment step on an imaging sheet containing a layer of microcapsules either prior to or after exposure of the sheet to actinic radiation.

In one embodiment of the present invention, the method of processing the imaging sheets includes the steps of providing an imaging sheet having coated on one of its surfaces a layer of microcapsules, the microcapsules containing a radiation curable composition and having an image-forming agent associated therewith; heating the sheet; and image-wise exposing the layer of microcapsules to actinic radiation. To produce an image, the microcapsules are thereafter subjected to a uniform rupturing force in the presence of a developer material to rupture the microcapsules and form an image.

When performing the heating step prior to exposing the microcapsules on the imaging sheet to actinic radiation, the images produced have an improved background hue and the dynamic range of the imaging sheet is significantly extended. The extension of the dynamic range of microcapsules in a full color system enables the production of a more neutral media image.

In another embodiment of the present invention, the steps are performed as described above, with the exception that the heating step is performed after image-wise exposing to actinic radiation. Conducting the process according to this embodiment produces a background which is much improved and presents a clear white background. In this embodiment, the photographic properties of the imaging sheet are not affected.

The pre-exposure and post-exposure heat treatment steps provide an excellent mechanism for damage removal. This produces a superior quality image, and eliminates the presence of undesirable defects such as fingerprints and scratches.

To maximize the quality of the image produced, while extending the dynamic range of the microcapsules, two heating steps may be performed, one before exposure of the sheet to actinic radiation, and one subsequent to exposure.

The image-forming process, according to the present invention, may be utilized in a transfer system such as that disclosed in U.S. Pat. No. 4,399,209 wherein separate imaging and developer sheets are used to form the image, or may be utilized in a self-contained system such as that disclosed in U.S. Pat. No. 4,440,846, wherein the image-forming agent and developer material are located on the same substrate to improve the dynamic range of the microcapsules when the substrate is relatively free from defects.

The above described image-forming processes are characterized in that heat is used to produce superior images, and that no additives such as films or particulates need to be added to the composition. In addition, the image-forming process according to the present invention may be used for systems which contain monochromatic imaging sheets, polychromatic imaging sheets or panchromatic imaging sheets.

Accordingly, it is an object of the present invention to provide a method for treating imaging sheets which produces images having reduced background defects.

It is an additional object of the present invention to provide an image-forming process which produces images having improved background.

It is yet another object of the present invention to provide a method for treating imaging sheets which minimizes handling problems associated with imaging sheets.

It is a further object of the present invention to provide an image-forming process utilizing color forming microcapsules which have extended dynamic range and decreasing gamma.

It is still another object of the present invention to provide an image-forming process which produces improved continuous tones.

Another object of the present invention is to provide an image-forming process which utilizes heat for improving the image produced, and does not require the addition of other materials such as films, sprays, or silver-based photoinitiators to the color forming microcapsules.

It is yet another object of the present invention to provide an image-forming process producing improved images in either a transfer coating system or in a self-contained system.

Another object of the present invention is to provide an image-forming process which produces improved quality images in either monochromatic, polychromatic or panchromatic imaging systems.

It is still a further object of the present invention to provide an image-forming process which produces images having minimal defects without affecting the photographic speed used in forming the image.

These, and other objects, will be readily understood by one skilled in the art as reference is made to the following detailed description of the preferred embodiment.

DETAILED DESCRIPTION OF THE PREFERRED EMBODIMENT

In describing the preferred embodiments, certain terminology will be used for the sake of clarity. This terminology encompasses all technical equivalents which perform substantially the same function in substantially the same way to produce substantially the same result.

The initiate the process according to the present invention, an imaging sheet must be provided. The imaging sheet has on one of its surfaces a layer of microcapsules coated thereon. The microcapsules contain a radiation curable composition, as well as a photoinitiator. In association with the microcapsules is an image-forming agent.

The photographic materials of the present invention can be used in conjunction with various radiation sensitive materials, photoinitiators and image-forming agents to produce images by a number of different techniques.

For example, positive working photohardenable or negative working photosoftenable radiation sensitive compositions can be present in the internal phase of the microcapsules. Photohardenable compositions such as photopolymerizable and photocrosslinkable materials increase in viscosity or solidify upon exposure to radiation and yield positive images.

Ethylenically unsaturated organic compounds are useful radiation curable materials. These compounds contain at least one terminal ethylene group per molecule. Typically, they are liquid. Polyethylenically unsaturated compounds having two or more terminal ethylene groups per molecule are preferred. An example of this preferred subgroup is ethylenically unsaturated acid esters of polyhydric alcohols, such as trimethylol propane triacrylate (TMPTA) and dipentaerythritol hydroxypentaacrylate (DPHPA).

A preferred photoinitiator system for use in the present invention includes ionic dye-counter ion compounds described in European Application Publication No. 0 233 587. A preferred class of ionic dye-counter ions is cationic dye borates and still more particularly cyanine dye borates. Typically the borate is a triphenylalkyl borate such as a triphenylbutyl borate. Other dye complexes such as Rose Bengal iodonium and Rose Bengal pyryllium complexes may also be used.

Examples of other photoinitiators useful in the present invention include diaryl ketone derivatives, quinones and benzoin alkyl ethers. Where ultraviolet sensitivity is desired, suitable photoinitiators include alkoxy phenyl ketones, O-acylated oximinoketones, polycyclic quinones, phenanthrenequinone, naphthoquinone, diisopropylphenanthenequinone, benzophenones and substituted benzophenones, xanthones, thioxanthones, halogenated compounds such as chlorosulfonyl and chloromethyl polynuclear aromatic compounds, chlorosulfonyl and chloromethyl heterocyclic compounds, chlorosulfonyl and chloromethyl benzophenones and fluorenones and haloalkanes. In many cases it is advantageous to use a combination with imaging photoinitiators.

Initiators including the ionic dye complexes may preferably include an autoxidizer. Suitable examples include N,N,-dialkylanilines as described in the European Publication.

The photoinitiators according to the present invention are not based upon silver halide photoinitiators.

Various image-forming agents can be used in association with the radiation curable composition. For example, images can be formed by the interaction of color formers and color developers of the type conventionally used in the carbonless paper art. In addition, images can be formed by the color producing interaction of a chelating agent and a metal salt or by the reaction of certain oxidation-reduction reaction pairs, many of which have been investigated for use in pressure-sensitive carbonless papers. Alternatively, an oil soluble dye can be used and images can be formed by transfer to plain or treated paper. The internal phase itself has its own image-forming capability. For example, it is known that many of the toners used in xerographic recording processes selectively adhere to the image areas of an imaging sheet exposed and developed as in the present invention.

Furthermore, the image-forming agent can be provided inside the microcapsules, in the microcapsule wall, or outside the microcapsules in the same layer as the microcapsules or in a different layer. In the latter cases, the internal phase picks up the image-forming agent (e.g., by dissolution) upon being released from the microcapsules and carries it to the developer layer or an associated developer sheet.

Typical color precursors useful in the aforesaid embodiments include colorless electron donating type compounds. Representative examples of such color formers include substantially colorless compounds having in their partial skeleton a lactone, a lactam, a sulfone, a spiropyran, an ester or an amido structure such as triarylmethane compounds, bisphenylmethane compounds, xanthene compounds, fluorans, thiazine compounds, spiropyran compounds and the like. Crystal Violet Lactone and Copikem X, IV and XI are often used alone or in combination as color precursors in the present invention.

The discrete walled microcapsules used in the present invention can be produced using known encapsulation techniques including coacervation, interfacial polymerization, polymerization of one or more monomers in an oil, etc. Representative examples of suitable wall-formers are gelatin materials (see U.S. Pat. Nos. 2,730,456 and 2,800,457 to Green et al.) including gum arabic, polyvinyl alcohol, carboxy-methyl-cellulose; resorcinol-formaldehyde wall formers (see U.S. Pat. No. 3,755,190 to Hart et al.); isocyanate wall-formers (see U.S. Pat. No. 3,914,511 to Vassiliades); isocyanate-polyol wall-formers (see U.S. Pat. No. 3,796,669 to Kiritani et al.); urea-formaldehyde wall-formers, particularly urea-resorcinol-formaldehyde in which oleophilicity is enhanced by the addition of resorcinol (see U.S. Pat. Nos. 4,001,140; 4,087,376 and 4,089,802 to Foris et al.); and melamine-formaldehyde resin and hydroxypropyl cellulose (see commonly assigned U.S. Pat. No. 4,025,455 to Shackle). A melamine-formaldehyde capsule is particularly preferred.

The mean microcapsule size used in the present invention generally ranges from about 1 to 25 microns.

The most common substrate for imaging sheets in accordance with this invention is a transparent film or paper. The paper may be a commercial impact raw stock, or special grade paper such as cast-coated paper or chrome-rolled paper. The latter two papers are preferred when using microcapsules having a diameter between approximately 1 and 5 microns because the surface of these papers is smoother and therefore the microcapsules are not as easily embedded in the stock fibers. Transparent substrates such as polyethylene terephthalate and translucent substrates can also be used in this invention. Another preferred substrate for the microcapsules is aluminized Mylar (PET). The microcapsules can be located on either the top or bottom surface of a transparent substrate to form an imaging sheet.

The imaging sheet may be utilized in a monochromatic, polychromatic, or panchromatic imaging system depending on the different types of color forming agents provided on the imaging sheet. For example, full color and panchromatic imaging systems are described in U.S. Pat. No. 4,576,891, European Published Application No. 0 223 587 and U.K. Pat. No. 2,113,860. These systems are preferably single exposure systems which employ imaging sheets having three sets of microcapsules which respectively contain cyan, magenta and yellow color precursors. As explained in more detail in the references, each set of microcapsules is primarily sensitive in a different wavelength band such that the microcapsules can be individually exposed with minimum cross-talk. In panchromatic systems, the cyan, magenta and yellow forming photosensitive microcapsules are respectively sensitive to red, green and blue light.

Once prepared, the imaging sheet then undergoes a heat treatment step. The heat treatment step may occur either before exposure of the microcapsules to actinic radiation or after exposure of the microcapsules to actinic radiation.

The heating step comprises heating the microcapsules from ambient temperatures to temperatures above 45° C. at atmospheric pressures. A preferred temperature range is between about 45° C. and about 200° C., with a more preferred range being between about 90° C. and about 150° C. Heating may be accomplished by using an apparatus such as an oven, heated forced air, etc.

The times for heating the imaging sheets are dependent upon the type of initiator utilized and the heating temperature. Sufficient results can be obtained when the imaging sheet is heated for a time period as short as 30 seconds or as long as 20 minutes. When the imaging sheet is heated for greater than 20 minutes, the microcapsules are susceptible to inadvertent hardening as a result of thermal polymerization of the radiation curable composition. If this occurs, the image produced will be completely white as no color-forming agent will be released from the microcapsules.

The imaging sheet is then exposed to actinic radiation such that the microcapsules are image-wise exposed. The term "actinic radiation" encompasses wavelengths in the ultraviolet spectral region, visible region, and infrared spectral region. In practice, ultraviolet and visible wavelengths are preferred. Depending on the exposure source used and the nature of the exposing radiation, the exposure causes a change in the viscosity of the internal phase of the microcapsules to control imaging. Typically, exposure of the microcapsules to actinic radiation causes the radiation curable composition to polymerize and thereby cause the internal phase to increase in viscosity, thereby preventing the escape of the image-forming agent from the imaging sheet.

As discussed above, in accordance with the present invention, the exposure step may occur either before heating the imaging sheet or after heating the imaging sheet. If desired, it is comtemplated that heating steps may occur both before exposure and after exposure.

Once the imaging sheet has been exposed to actinic radiation, the microcapsules on the imaging sheet are subjected to a uniform rupturing force in the presence of a developer material to rupture the microcapsules to form an image.

The developer material is selected to react with the image-forming agent to form an image. Illustrative examples of color developers useful in conjunction with the embodiment employing the aforesaid color precursors are clay minerals such as acid clay, active clay, attapulgite, etc.; organic acids such as tannic acid, gallic acid, propyl gallate, etc.; acid polymers such as phenol-formaldehyde resins, phenol acetylene condensation resins, condensates between an organic carboxylic acid having at least one hydroxy group and formaldehyde, etc.; metal salts or aromatic carboxylic acids such as zinc salicylate, tin salicylate, zinc 2-hydroxynaphthoate, zinc 3,5 di-tert-butyl salicylate, oil soluble metal salts or phenol-formaldehyde novolak resins (e.g., see U.S. Pat. Nos. 3,672,935; 3,732,120 and 3,737,410) such as zinc modified oil soluble phenol-formaldehyde resin as disclosed in U.S. Pat. No. 3,732,120, zinc carbonate etc. and mixtures thereof. A preferred class of glossable developers is described in commonly assigned U.S. application Ser. No. 073,036, filed July 14, 1987.

The developer material may be located on a support separate from the imaging sheet to thereby forming a transfer image coating system. In such a system the imaging sheet and the developer sheet are brought together in the presence of a uniform rupturing force to cause the image-forming agent to migrate to the developer sheet and form an image on the developer sheet. Alternatively, the developer material may be located on the same surface the layer of microcapsules to form a self-contained sheet.

By performing the above-described method, superior images are produced in terms of background hues and image defects. It is hypothesized that although an overwhelming majority of the internal phase is encapsulated in the microcapsules, a minimal amount of internal phase is not encapsulated. Accordingly, when coating the microcapsules onto the imaging sheet, the unencapsulated intended internal phase is unprotected from stresses from handling and shipment. Accordingly, such stresses would cause defects in the imaging sheet, and therefore present the formation of a continuous, white, background hue. While not desiring to be bound exclusively by this theory, the inventors believe that heating the imaging sheet prior to developing causes the unencapsulated intended internal phase to become imbedded or immobilized on the imaging sheet. It is further hypothesized that the heat treatment may polymerize the unencapsulated material and prevent it from forming an unwanted image without polymerizing the internal phase of the microcapsules.

A further benefit obtained by utilizing the present invention that the density and amount of damage marks on the imaging sheet are significantly reduced by heat treatment. If the imaging sheet has a high density and amount of damage marks, the use of a heat treatment step reduces such marks. For example, studies have been done which demonstrate that imaging sheets having intentionally induced damage caused by abrasive materials, such as brushes, can be reduced by at least 75%.

In situations where the density and amount of defects are smaller, the present method can almost completely remove the defects. Although, on a quantitative basis, the reduction of density of the defects is not as great as that described above, qualitatively, a much more superior image is produced.

The inventors have further discovered that the use of a heat treatment step after exposure of the imaging sheet to actinic radiation produces a slightly superior background image than that produced by the inventive method when the heating step is performed prior to exposure. Further, by performing the heat treatment step after exposure, the photographic speed of the image-forming agent is not affected. While not wishing to be bound by this theory, it is hypothesized that the "shoulder speed" of the imaging sheet, (as would be seen on an H & D curve) is not affected because the shoulder speed is likely a function of the concentration of oxygen present in the encapsulated internal phase. As heat treatment does not affect the concentration of oxygen present in the microcapsules, the shoulder speed is unchanged.

It has further been discovered that in limited circumstances, the process according to the present invention can extend the dynamic range of the image-forming agents. Densitometry evaluation has shown that the increase in dynamic range is caused by extending the toe of the corresponding H & D curve for a given image-forming agent without lowering the maximum density value of the shoulder portion of the H & D curve. This phenomenon is only seen in a process which uses a pre-exposure heating step.

In addition to extending the dynamic range, the inventors have discovered that the heating tends to effect certain internal phase compositions more significantly than others. For example, in a full color system, three sets of microcapsules are used, one set containing cyan color-forming agents, one set containing magenta color-forming agents, and one set containing yellow color-forming agents. In this system, the pre-exposure heat treatment significantly effects the dynamic range of the cyan microcapsules, slightly effects the dynamic range of magenta capsules, and has little or no effect upon the dynamic range of yellow microcapsules. The extension of the dynamic range being dependent upon the initiator utilized cause the H & D curves of the full color system to be more aligned. Accordingly, a more continuous and neutral tone image may be produced. While not wishing to be bound by this theory, it is hypothesized that the selectivity of the dynamic range being dependent upon the image-forming agent utilized may be a function of the photochemical properties of the photo-initiator of the respective microcapsules.

It is has further been discovered that when utilizing a pre-exposure heating step to improve the extended range of the image-forming agents, the imaging sheet may be held at ambient temperatures for a lengthy period of time to render the extension in dynamic range irreversible. Holding times from about 2 minutes to at least 12 hours have produced imaging sheets containing image-forming agents having extended dynamic ranges.

The present invention is further illustrated by the following non-limiting examples.

COMPARATIVE EXAMPLE 1

The following internal phase was encapsulated in urea-formaldehyde walls:

Trimethylolpropane Triacrylate (TMPTA) 18000 g
Thioxanthane Initiator 360 g
Magenta Color Former 3500 g
Desmodur N-100 Isocyanates 1280 g The capsules were coated onto a paper substrate. The substrate was treated with a soft but coarse material to produce "pin-point" type defects. The substrate was exposed to light from a fluorescent desk lamp and after exposure, an image was produced by applying pressure to the microcapsules in the presence of a developer resin. The granularity of this image was 10.2, corresponding to a categorization of "very coarse" according to the Kodak Graininess and Granularity Categories Table.

EXAMPLE 1

The experiment of Comparative Example 1 was repeated with the exception that the exposed coated substrate was heated at a temperature of 150° C., for two minutes prior to developing. The granularity of this image was 0.52, corresponding to a categorization of "fine" according to the Kodak Categories Table.

EXAMPLE 2

The following internal phases were individually encapsulated in urea-formaldehyde capsule walls to form three sets of microcapsules containing cyan, magenta, and yellow color-formers respectively.

Cyan Internal Phase

Trimethylolpropane Triacrylate (TMPTA) 4201 g
Dipentaerythritol Hydroxypentaacrylate (DPHPA) 1800 g
Cyanine Borate Initiator 36 g
Diisopropyl Dimethylamine (DIDMA) 60 g
Cyan Color Former 721 g
Desmodur N-100 Isocyanates 400 g

Magenta Internal Phase

TMPTA 6002 g
Cyanine Borate Initiator 24 g
DIDMA 60 g
Magenta Color Former 1441 g
Desmodur N-100 Isocyanates 400 g

Yellow Internal Phase

TMPTA 6016 g
Ketocoumarin Inititor 36 g
DIDMA 60 g
Reakt Yellow Color Former 721 g
Desmodur N-100 Isocyanates 398 g The microcapsules were coated onto a 3-mil film. Different samples of the coated film were then subjected to the following alternative heat treatment steps prior to exposure to radiation.

| Sample | Treatment Step |
|---|---|
| a | Unheated |
| b | Heated in 90° C. oven for 30 minutes, held at ambient conditions for 2 mintues |
| c | Heated in 150° C. oven for 10 seconds, held at ambient conditions for 2 minutes |
| d | Heated in 150° C. oven for 30 seconds, held at ambient conditions for 2 minutes |
| e | Heated in 150° C. oven for 1 minute, held at ambient conditions for 2 minutes |
| f | Heated in 150° C. oven for 1 minute, held at ambient conditions overnight |

The different samples were then exposed to radiation by exposure for 10 seconds to a tungsten halogen light source through a neutral density filter. An image was produced by applying pressure to the microcapsules in the presence of a developer resin. Samples a and c produced images having an undesirable background hue while samples b, d, e, and f produced images having an acceptable white background hue. In samples b, d, e, and f, the dynamic range of the microcapsules was extended, thereby lowering the gamma. The dynamic range was extended at least three stops. The extension of the dynamic range effected the cyan capsules the most, the magenta capsules next and had the least effect on the yellow capsules. This caused the sensitivity curves to be more aligned, thereby producing a more neutral media.

Having described the invention in detail and by reference to preferred embodiments thereof, it will be apparent that modifications and variations are possible without departing from the scope of the invention defined in the appended claims.

What is claimed is:

1. A method for treating an imaging sheet comprising the steps of:
   providing an imaging sheet having coated on one of its surfaces a layer of microcapsules, said microcapsules containing a radiation curable composition and having an image-forming agent associated therewith;
   heating said sheet; and
   image-wise exposing said layer of microcapsules to actinic radiation;
   wherein said heating step is performed prior to said image-wise exposing step.

2. The method according to claim 1 comprising the additional step of subjecting said microcapsules to a uniform rupturing force in the presence of a developer material to rupture said microcapsules and form an image.

3. The method according to claim 2 wherein said subjecting said microcapsules to a uniform rupturing force in the presence of a developer material step comprises bringing together said imaging sheet and a developer sheet comprising a substrate having coated on one of its surfaces said developer material such that said image-forming agent migrates to said developer material.

4. The method according to claim 2 wherein said microcapsules and said developer material are on a self-contained sheet.

5. The method according to claim 1 wherein said imaging sheet is a panchromatic imaging sheet and wherein said actinic radiation comprises visible light.

6. The method according to claim 1 wherein said imaging sheet comprises a monochromatic imaging sheet.

7. The method according to claim 1 wherein said imaging sheet comprises a polychromatic imaging sheet.

8. The method according to claim 1 wherein said heating step heats the imaging sheet at a temperature between about 45° C. and about 200° C.

9. The method according to claim 1 wherein the time for heating the sheet is between about 30 seconds and about 20 minutes.

10. The method according to claim 1 wherein after said step of heating said imaging sheet, said method includes the step of maintaining said sheet at ambient temperatures for a period of time before performing said image-wise exposing step.

11. The method according to claim 10 wherein said sheet is held at ambient temperatures from between about 2 minutes and 12 hours.

12. The method according to claim 1 wherein said radiation curable composition includes a photoinitiator comprising an ionic dye-counter ion compound.

13. A method for treating an imaging sheet comprising the steps in the order of:
 providing an imaging sheet having coated on one of its surfaces a layer of microcapsules, said microcapsules containing a radiation curable composition and having an image-forming agent associated therewith;
 heating said sheet;
 image-wise exposing said layer of microcapsules to actinic radiation; and
 re-heating said sheet.

14. The method according to claim 13 comprising the additional step of subjecting said microcapsules to a uniform rupturing force in the presence of a developer material to rupture said microcapsules and form an image.

* * * * *